(12) United States Patent
Kono et al.

(10) Patent No.: US 7,214,271 B2
(45) Date of Patent: May 8, 2007

(54) SILICON SINGLE CRYSTAL WAFER PROCESS APPARATUS, SILICON SINGLE CRYSTAL WAFER, AND MANUFACTURING METHOD OF SILICON EPITAXIAL WAFER

(75) Inventors: Ryuji Kono, Annaka (JP); Shoichi Takamizawa, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 49 days.

(21) Appl. No.: 10/489,918

(22) PCT Filed: Sep. 25, 2002

(86) PCT No.: PCT/JP02/09825

§ 371 (c)(1),
(2), (4) Date: Mar. 18, 2004

(87) PCT Pub. No.: WO03/030251

PCT Pub. Date: Apr. 10, 2003

(65) Prior Publication Data

US 2004/0241992 A1    Dec. 2, 2004

(30) Foreign Application Priority Data

Sep. 27, 2001 (JP) .............................. 2001-297518

(51) Int. Cl.
C30B 7/10 (2006.01)
C30B 35/00 (2006.01)
H01L 21/00 (2006.01)
H01L 39/00 (2006.01)

(52) U.S. Cl. .................................................... 117/223

(58) Field of Classification Search ................. 117/223
See application file for complete search history.

(56) References Cited

U.S. PATENT DOCUMENTS

| 5,462,603 A | 10/1995 | Murakami |
| 6,146,504 A | 11/2000 | Patadia et al. |
| 6,211,088 B1 | 4/2001 | Masuda et al. |

FOREIGN PATENT DOCUMENTS

| JP | A 62-204535 | 9/1987 |
| JP | A 5-47906 | 2/1993 |
| JP | U 05-031238 | 2/1993 |
| JP | U 6-2677 | 1/1994 |
| JP | A 06-224281 | 8/1994 |

OTHER PUBLICATIONS

Colvin and Stanley, American Machinist's Handbook 1940, McGraw-Hill Book Company, 7th Edition, pp. 523-526.*
European Search Report.
Japanese Office Action and partial English translation of Japanese Office Action.

*Primary Examiner*—Tim Heitbrink
(74) *Attorney, Agent, or Firm*—Oliff & Berridge, PLC

(57) ABSTRACT

A silicon single crystal wafer process apparatus (10) having: a process chamber (11); a susceptor (12) which is disposed in the process chamber (11), and on an upper surface of which the silicon single crystal wafer (19) is placed; and a lift pin (14) which is provided to be capable of a going up and down operation with respect to the susceptor (12), for attaching or detaching the silicon single crystal wafer (19) to or from the susceptor (12) with the going up and down operation, in a state to support the silicon single crystal wafer (19) from a lower surface side, wherein the lift pin (14) is subjected to polishing on a contact end surface (14*d*) which contacts with a rear surface of the silicon single crystal wafer (19).

6 Claims, 4 Drawing Sheets

FOREIGN PATENT DOCUMENTS

| | | |
|---|---|---|
| JP | A 7-22489 | 1/1995 |
| JP | A 07-153825 | 6/1995 |
| JP | A 08-288190 | 11/1996 |
| JP | H09-266175 | 10/1997 |
| JP | H09-266214 | 10/1997 |
| JP | H10-106955 | 4/1998 |
| JP | A 11-67751 | 3/1999 |
| JP | 2000-026192 | 1/2000 |
| JP | A 2000-26192 | 1/2000 |
| JP | 2000-323556 | 11/2000 |
| JP | 2001-237171 | 8/2001 |

\* cited by examiner

SILICON SINGLE CRYSTAL WAFER PROCESS APPARATUS, SILICON SINGLE CRYSTAL WAFER, AND MANUFACTURING METHOD OF SILICON EPITAXIAL WAFER

FIELD OF THE INVENTION

This invention relates to a silicon single crystal wafer process apparatus, a silicon single crystal wafer, and a manufacturing method of a silicon epitaxial wafer.

BACKGROUND ART

For example, an apparatus for performing a process of a vapor phase growth or the like to a silicon single crystal wafer (hereinafter, referred simply as a wafer) is comprised that a wafer is transferred into a process chamber to perform a process in a state of being placed on a susceptor in the process chamber, and after the process, the wafer on the susceptor is transferred out of the process chamber.

In this case, there are various systems for placing the wafer on the susceptor or taking the wafer from the susceptor. As one of them, a system (hereinafter, referred as a lift pin system) has been well known that, for example, at least three lift pins or more provided to be capable of projection above an upper surface of a susceptor are operated to project an approximately equal length to one another, a wafer is transferred onto the lift pins which were projected to make the three or more than three lift pins support the wafer in an approximately horizontal condition, and the lift pins are gone down one another in synchronization to place the wafer onto the susceptor, meanwhile the placed wafer is gone up above the susceptor by the projection operation of the lift pins to carry the wafer out of the process chamber by a carrying apparatus (refer to Japanese Patent Application Laid Open No. 205130/1997).

However, in the lift pin system described above, when a wafer is performed mirror finished to both side surfaces of the wafer, the wafer may have a contact mark by a lift pin on a lower surface (that is, rear surface) of the wafer and appearance of the wafer becomes bad.

This invention has been accomplished for solving the aforementioned problem. An object of this invention is to provide a lift pin system of silicon single crystal wafer process apparatus capable of obtaining a silicon single crystal wafer with good appearance, a manufacturing method of a silicon epitaxial wafer, and a silicon single crystal wafer with good appearance even in the case of being attached to or detached from a susceptor in the lift pin system to perform process.

DISCLOSURE OF THE INVENTION

In order to attain the above described object, in accordance with a first aspect of this invention, the silicon single crystal wafer process apparatus comprises: a process chamber; a susceptor which is disposed in the process chamber, and on an upper surface of which the silicon single crystal wafer is placed; and a lift pin which is provided to be capable of a going up and down operation with respect to the susceptor, for attaching or detaching the silicon single crystal wafer to or from the susceptor with the going up and down operation, in a state to support the silicon single crystal wafer from a lower surface side, wherein the lift pin is polished on a contact end surface which contacts with a rear surface of the silicon single crystal wafer.

Preferably, the contact end surface is formed in an upwardly convex curved shape.

Preferably, the contact end surface of the lift pin is formed with a surface roughness of 0.8 µm or less.

Further, preferably, at least the contact surface of the lift pin comprises SiC.

In accordance with a second aspect of this invention, the silicon single crystal wafer process apparatus comprises: a process chamber; a susceptor which is disposed in the process chamber, and on an upper surface of which the single crystal wafer is placed; and a lift pin which is provided to be capable of a going up and down operation with respect to the susceptor, for attaching or detaching the silicon single crystal wafer to or from the susceptor with the going up and down operation, in a state to support the silicon single crystal wafer from a lower surface side, wherein a cylindrical member which can slidably guide the lift pin while moving upward, is fixedly provided on a susceptor support member, in a state to project from the susceptor support member which supports the susceptor, to make a contact end surface of the lift pin contact with the rear surface of the silicon single crystal wafer so as to be approximately parallel to the rear surface.

A sliding surface of the lift pin to the cylindrical member may be polished.

According to the silicon single crystal wafer process apparatus of this invention, it can be suppressed that a contact mark by the lift pins remains on the rear surface of the silicon single crystal wafer, and it is possible to obtain the silicon single crystal wafer with good appearance.

Hereupon, the silicon single crystal wafer process apparatus of this invention includes for example, a vapor phase growth apparatus for growing a thin film (single crystal thin film or poly crystal thin film) on a front surface of a silicon single crystal wafer in vapor phase, however, it is not limited thereto. For example, an apparatus which performs a prescribed heat treatment to a silicon single crystal wafer may be included.

In accordance with a third aspect of this invention, the silicon single crystal wafer comprises: a silicon oxide film to prevent scratch generation formed on a rear surface on which mirror finished was performed.

Preferably, the silicon oxide film has a thickness of 50 nm or more and 200 nm or less.

In accordance with a forth aspect of this invention, the manufacturing method of a silicon epitaxial wafer comprises: a first mirror finished step of performing mirror finished on at least a rear surface of a silicon single crystal wafer; an oxide film formation step for forming a silicon oxide film on the rear surface of the silicon single crystal wafer; a second mirror finished step of performing mirror finished on a front surface of the silicon single crystal wafer; and a vapor phase growth step of growing a silicon epitaxial layer on the front surface of the silicon single crystal wafer in vapor phase, using a vapor phase growth apparatus which comprises a lift pin for attaching or detaching the silicon single crystal wafer to or from a susceptor, wherein the steps are performed in this order.

BEST MODE FOR CARRYING OUT THE INVENTION

Figure 1:
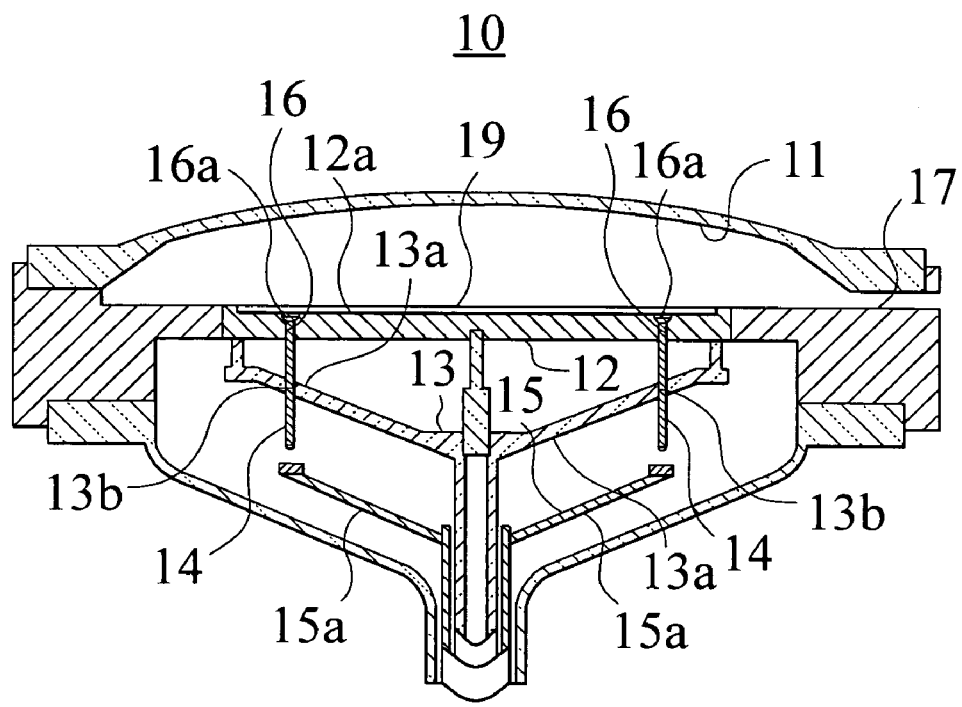
FIG. 1 is a cross sectional view showing a vapor phase growth apparatus as an embodiment of a process apparatus according to this invention.

An embodiment according to this invention will be explained referring to the drawings below.

[First Embodiment]

In this embodiment, a vapor phase growth apparatus will be explained as a preferred embodiment of a silicon single crystal wafer process apparatus according to this invention.

Figure 2:
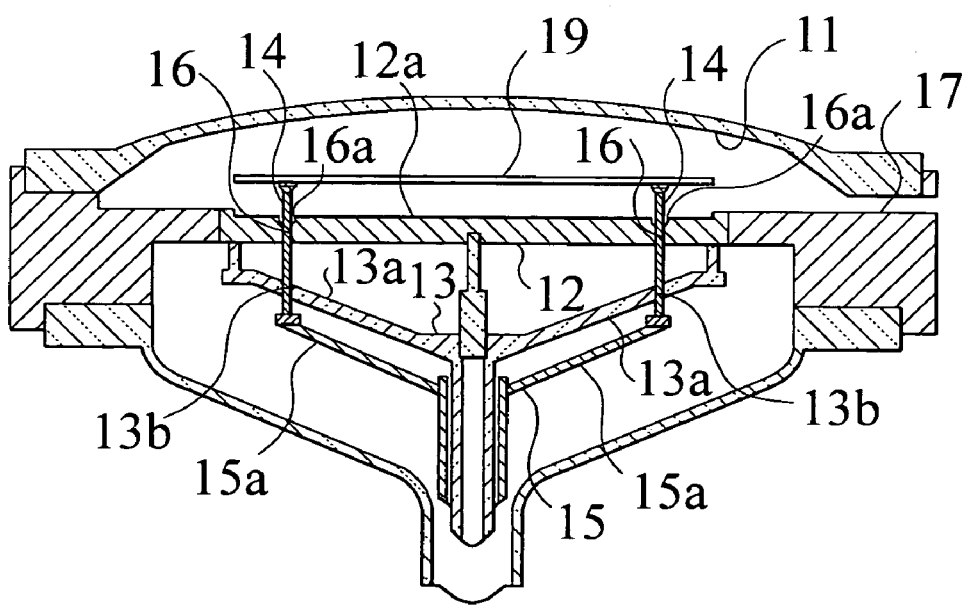
FIG. 2 is a view showing a state where lift pins of the vapor phase growth apparatus in FIG. 1 are moved up.

FIGS. 1 and 2 show, for example, a single wafer type vapor phase growth apparatus 10 which is schematically comprised of a reaction chamber (process chamber) 11, a susceptor 12 which is disposed in the reaction chamber 11, and on an upper surface of which a silicon single crystal wafer 9 (hereinafter, also referred simply as a wafer 9) is placed, a feed path 17 for feeding reaction gas on a front surface of the wafer 19 placed on the susceptor 12, a susceptor support member 13 for supporting the susceptor 12, lift pins 14 which are provided in a state of penetrating from front to rear of the susceptor 12, and are movable up and down with respect to the susceptor 12, and a lift pin going up and down member 15 for going up or going down the lift pins 14 by supporting the lift pins from a lower side.

The susceptor 12 is schematically formed in a disk shape, and comprises a pocket 12a on an upper surface thereof for placing the wafer 19 therein. The susceptor 12 is supported by a plurality of support arms 13a which are radially provided in the susceptor support member 13 from a lower side to keep the upper surface in an approximately horizontal position.

Figure 3:
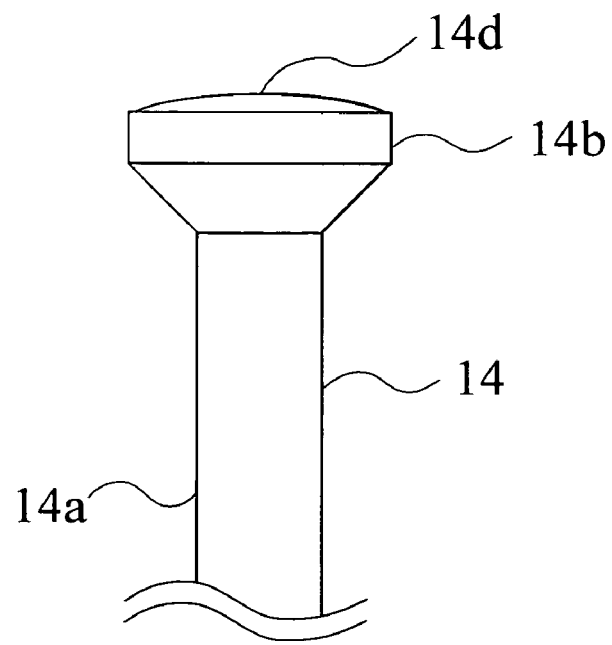
FIG. 3 is an enlarged view showing a portion near a contact end surface of the lift pin to a silicon single crystal wafer.

The lift pins 14 are, for example, obtained by growing a SiC film (for example, approximately 100 μm in thickness) by CVD (Chemical Vapor Deposition) on a raw material of carbon. For example, as shown in FIG. 3, a lift pin 14 comprises a body part 14a formed in a round bar shape, and a head part 14b formed on an upper end part of the body part 14a to support the wafer 19 from a lower surface side. The head part 14b has a diameter larger than that of the body part 14a to easily support the wafer 19.

An upper surface (contact end surface) 14d of the head part 14b of the lift pin 14 is formed in a curved surface shape which is convex upward and has a gently changing curvature, and is polished.

Specifically, for example, it is preferable that the upper surface 14d of the head part 14b is comprised that the upper surface 14d is pre-formed in a curved surface shape before CVD growth of a SiC film and is subjected to curved surface polish finished by a grinder after CVD growth. In this case, for polishing accuracy, it is preferable that a surface roughness is, for example, 0.8 μm and below. For polishing by the grinder, with regard to forming the SiC film on the surface of the lift pin, it is preferable to polish using SiC grindstone made from the similar material (hereinafter, named as "same material abrasive polishing").

By performing the same material abrasive polishing in this manner, it can prevent that foreign material mix into a polished surface of the SiC film. Moreover, the lift pin 14 from which polished powder is sufficiently removed is obtained by cleaning the polished surface.

Figure 4:
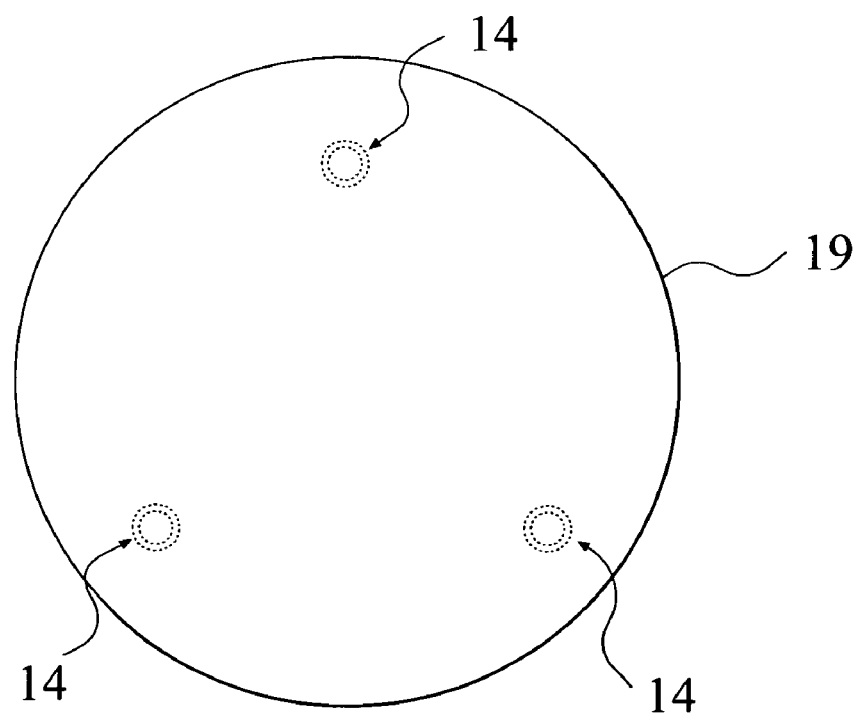
FIG. 4 is a plan view showing portions on the silicon single crystal wafer, supported by the lift pins.

FIGS. 1 and 2 show only two lift pins 14 as cross sectional views, however, the lift pins 14 are arranged in three positions at a uniform angle interval on a circumference, sharing the same center with the pocket 12a, so that the wafer 19 is supported at the three points (refer to FIG. 4).

The susceptor 12 is provided with through holes 16 which penetrate the susceptor 12a from front to rear. Each through hole 16 has a head receiving part 16a at an upper part, which is formed to have a size and a shape capable of receiving the head part 14b of the lift pin 14. At a part lower than the head receiving part 16a, each through hole 16 is set to have a diameter which is smaller than that of the head part 14b of each lift pin 14, and is larger than that of the body part 14a. Each lift pin 14 is inserted into each through hole 16 of the susceptor 12 from a lower end thereof, and is in a state of being supported by the head receiving part 16a of each through hole 16. The body part 14a of each lift pin 14 also penetrates a through hole 13b provided in each support arm 13a of the susceptor support member 13.

A lift pin going up and down member 15 is gone up or down by a driving apparatus which is not shown.

The lift pin going up and down member 15 comprises a plurality of radially extending support arms 15a. Each support arm 15a supports a corresponding lift pin 14 at an upper surface of a tip thereof to go up or down each lift pin 14, thereby going up or going down each lift pin 14 with respect to the susceptor 12.

Figure 5:
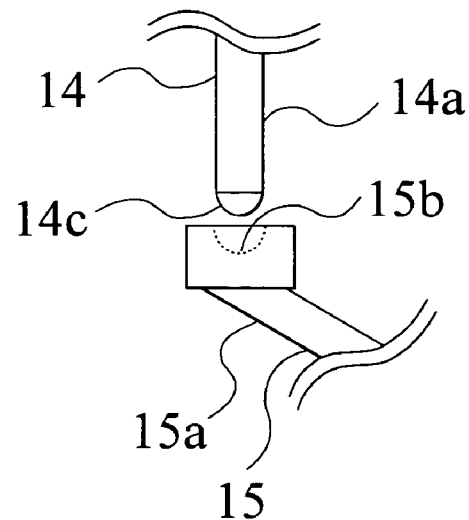
FIG. 5 is a main portion enlarged view showing a lower end portion of the lift pin and a member for moving up the lift pin by supporting the lower part thereof.

For example, as shown in FIG. 5, a cavity portion 15b which is caved in a spherical shape is formed on an upper surface of a tip of each support arm 15a, whereas a lower surface of a lift pin 14 comprises a supported part 14c which is formed in a spherical shape capable of engaging into the cavity portion 15b. Therefore, the lift pin 14 can be positioned in the cavity portion 15b easily.

According to the vapor phase growth apparatus 100, a silicon single crystal thin film is epitaxially grown on the front surface of the wafer 19 in a manner described below.

First, as the lift pin going up and down member 15 is moved up, each lift pin 14 is projected to an approximately equal length to one another above the upper surface of the susceptor 12 (the state that there is no wafer 19 in FIG. 2). Further, the wafer 19 is carried by a handler which is not shown to place the wafer 19 whose front surface become up on the lift pins 14 after the project operation. Therefore, the wafer 19 becomes, for example as shown in FIG. 4, the state to be supported by the three lift pins 14 which are mutually separated at an approximately uniform interval (approximately uniform angle interval), from the lower surface side (that is, rear surface side).

Since the upper surface 14d of the head part 14b of each lift pin 14 is formed in a curved shape which is convex upward, and is polished, a contact mark by the lift pins 14 is unlikely to remain on the rear surface of the wafer 19.

Next, each lift pin 14 is gone down in synchronization with each other as the lift pin going up and down member 15 is gone down, while removing the handler. The wafer 19 is gone down keeping an approximately horizontal position, as the lift pins 14 are gone down.

When the lift pin going up and down member 15 is gone down to the degree that each lift pin 14 is supported by the head receiving part 16 of the upper part of each through hole 16 in the susceptor 12 without being supported by the lift pin going up and down member 15, the going down operation is completed.

At this stage, the head part 14b of each lift pin 14 is received by the head receiving part 16a of the upper part of each through hole 16 in the susceptor 12, while the wafer 19 moves to the state to be placed in the pocket 12a of the susceptor 12 from the state to be supported on the head parts 14b of the lift pins 14 (the state shown in FIG. 1).

When the wafer 19 is placed on the susceptor 12 as described, the vapor phase growth is performed.

That is, reaction gas (carrier gas and material gas) is fed from the feed path 17 of the upper side of the susceptor 12 while rotating the wafer 19 by rotating the susceptor 12 and also, heating the wafer 19 from above and below by a heating apparatus (not shown) such as an infrared ray lamp or the like, whereas purge gas is fed to the lower side of the susceptor 12, thereby growing a silicon epitaxial layer on the front surface of the wafer 19 in vapor phase.

When the vapor phase growth is completed, the wafer (silicon epitaxial wafer) 19 after the vapor phase growth is carried outside of the reaction chamber 11.

That is, the rotation of the susceptor 12 is preliminary stopped, and thereafter, each lift pin 14 is operated to project above the susceptor 12 synchronizing with each other, by going up the lift pin going up and down member 15. With the projection operation, the wafer 19 is gone up above the pocket 12a from inside of the pocket 12a of the susceptor 12. Thus, the wafer comes into the state to be supported by each lift pin 14 from the lower surface side (the state shown in FIG. 2). Then, the wafer 19 is carried by the handler which is not shown.

According to the first embodiment described above, since the upper surface 14d of the head part 14b of each lift pin 14 is formed in a curved shape which is convex upward, and is polished, it can suppress that a contact mark by the lift pins 14 remains on the rear surface of the wafer 19, enabling to obtain a silicon epitaxial wafer with good appearance.

[Modification]

Figure 6:
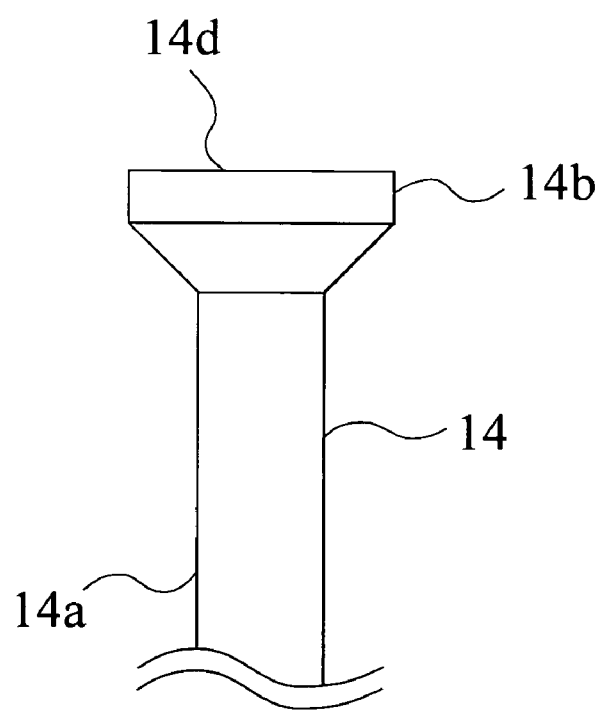
FIG. 6 is an enlarged view showing a portion near a contact end surface of a lift pin (modified embodiment) to the silicon single crystal wafer.

The lift pins 14 are not limited to the embodiment described above. For example, as shown in FIG. 6, an upper surface 14d of a head part 14b may be a flat surface which is polished. A polishing accuracy thereof is set as described above.

In the above described embodiment, the lift pins are subjected to the same material abrasive polishing with SiC, however, it is not limited thereto. For example, the lift pins may be polished with a material such as diamond or the like which is harder than SiC. Here, it is not preferable to polish with metal, because the lift pins may be affected by metal pollution.

[Second Embodiment]

The second embodiment also explains a vapor phase growth apparatus as a preferred embodiment of a silicon single crystal wafer process apparatus according to this invention. The vapor phase growth apparatus in the second embodiment is same as that in the first embodiment except points described below, thus the explanation except the points described below is omitted here.

Figure 7:
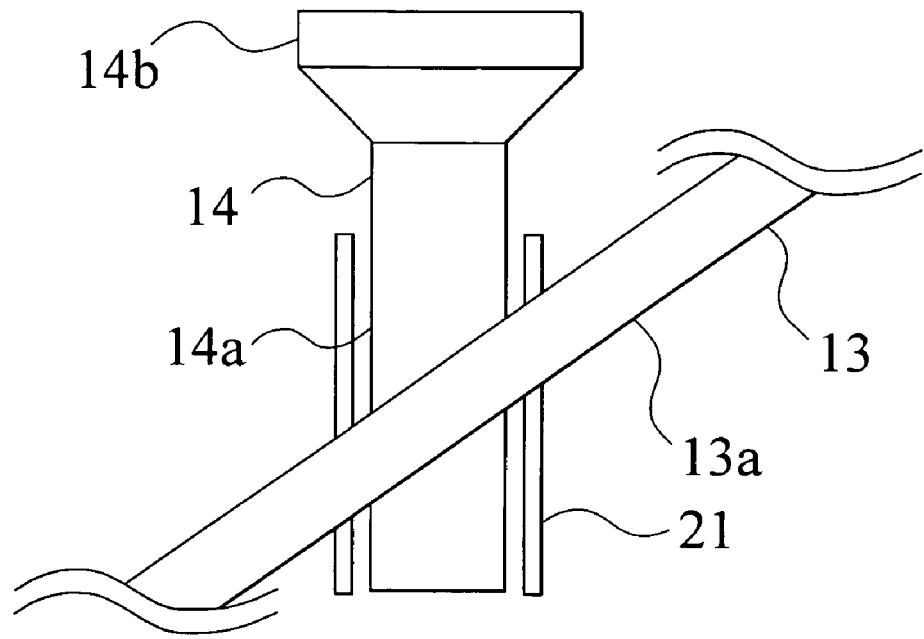
FIG. 7 is a main portion enlarged view showing a cylindrical member for guiding the lift pin.

That is, the vapor phase growth apparatus in the second embodiment, for example as shown in FIG. 7, comprises cylindrical members 21 which are capable to slidably guide a lift pin 14, while the going up operation of the lift pin 14. The cylindrical member 21 slidably guides the lift pin 14, so that an upper surface 14b of the lift pin 14 contacts with the rear surface (lower surface) of the silicon single crystal wafer 19 in an approximately parallel condition.

The cylindrical member 21 is, for example, fixedly provided on the susceptor support member 13 in a state to project upward and downward from the susceptor support member 13.

The susceptor support member 13 is made from, for example, quartz, and the cylindrical member 21 is also made from, for example, quartz.

An inner diameter of the cylindrical member 21 is set to be slightly larger than a diameter of the body part 14a of the lift pin 14.

A sliding surface of the lift pin 14 (that is, a periphery of the body part 14a) which slides on the inner surface of the cylindrical member 21 may be polished with a polishing accuracy similar to that in the above described first embodiment. In this case, particles generated by friction between the cylindrical member 21 and the lift pin 14 can be suppressed, so that a silicon epitaxial wafer reduced particle adhesion or formation of crystal defects can be obtained at high yield.

According to the second embodiment described above, since the cylindrical member 21 slidably guides the lift pin 14 while the lift pin 14 is gone up, the upper surface 14b of the lift pin 14 contacts with the rear surface of the silicon single crystal wafer 19 in an approximately parallel condition. Thus, it can suppress that a contact mark by the lift pins 14 remains on the rear surface of the wafer 19, enabling to obtain a silicon single crystal wafer with good appearance.

[Third Embodiment]

The third embodiment explains a silicon single crystal wafer and a manufacturing method of a silicon epitaxial wafer according to this invention. The explanation may be given by referring to the elements of the vapor phase growth apparatus 10 explained in the above first embodiment.

First, a silicon single crystal wafer in this embodiment will be explained.

Figure 8:
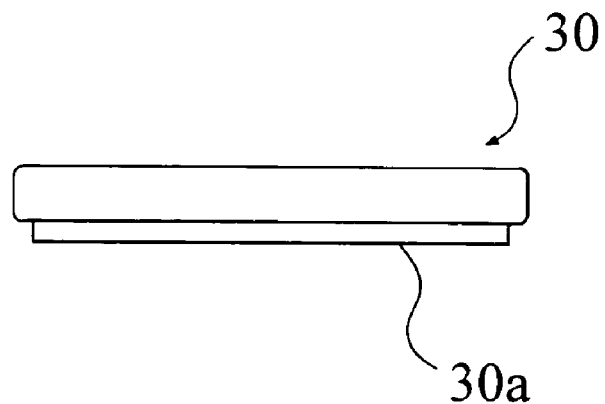
FIG. 8 is a side view showing the silicon single crystal wafer, which is formed a silicon oxide film on a rear surface.

A silicon single crystal wafer 30 in the third embodiment is, for example as shown in FIG. 8, formed a silicon oxide film 30a on a rear surface which was subjected to mirror finished. The silicon oxide film 30a is formed to prevent the rear surface from scratch generation by contacts with the lift pins 14 (for preventing scratch generation).

The silicon oxide film 30 may be formed by CVD (may be a CVD oxide film), or may be formed by heat oxidation (may be a thermal oxide film). However, a thermal oxide film is preferably used in view of a function for preventing the scratch formation because a thermal oxide film is dense in structure in comparison with a porous CVD oxide film.

For example, if a thickness of the silicon oxide film 30a is 50 nm or more and 200 nm or less, it is sufficient, however, it is not limited thereto. The film thickness may be more than 200 nm or less than 50 nm, if the film thickness is set enough to prevent the scratch formation caused by contacts of the upper surfaces 14d of the lift pins 14 with the rear surface of the silicon single crystal wafer 30.

In the third embodiment, the upper surface 14b of each lift pin 14 of the vapor phase growth apparatus 10 may be formed in a non-curved surface shape which is convex upward, or may be non-polished. However, the higher the polishing accuracy is and the smoother the curvature of the upper surface 14b formed to be convex upward changes, the thinner the film thickness of the silicon oxide film 30a necessary for preventing the scratch becomes.

Next, the manufacturing method of a silicon epitaxial wafer will be explained.

First, the rear surface of the silicon single crystal wafer is subjected to mirror finished (first mirror finished step).

Next, a silicon oxide film is formed on the rear surface of the silicon single crystal wafer (silicon oxide film formation step). Thereby, the silicon single crystal wafer 30 described above can be obtained.

Next, a front surface of the silicon single crystal wafer 30 is subjected to mirror finished (second mirror finished step).

Next, the vapor phase growth is performed by using the vapor phase growth apparatus 10 comprising the lift pins 14 by which a silicon single crystal wafer is attached to or detached from the susceptor 12 to epitaxially grow a silicon epitaxial layer on the front surface of the silicon single crystal wafer 30. That is, in the order as explained in the above first embodiment, the silicon single crystal wafer 30 is placed on the susceptor 12 to perform the vapor phase growth, and thereafter, the silicon epitaxial wafer is carried out of the reaction chamber 11.

According to the third embodiment described above, the silicon oxide film 30a formed on the rear surface of the silicon single crystal wafer 30 functions as a protection film, so that it can be prevented that a contact mark by the lift pins 14 remains on the rear surface.

In the third embodiment, the rear surface of the silicon single crystal wafer is subjected to mirror finished in the first mirror finished step, however, the rear surface and the front surface may be subjected to mirror finished in the first mirror finished step.

INDUSTRIAL APPLICATION

According to the silicon single crystal wafer process apparatus, the silicon single crystal wafer, and the manufacturing method of the silicon epitaxial wafer of this invention, it can suppress that a contact mark by the lift pins remains on the rear surface of the silicon single crystal wafer, enabling to obtain the silicon single crystal wafer with good appearance. Therefore, the silicon single crystal wafer process apparatus, and the silicon single crystal wafer and the manufacturing method of the silicon epitaxial wafer of this invention, are particularly suitable for performing the vapor phase growth to form a thin film on the front surface of the silicon single crystal wafer.

The invention claimed is:

1. A silicon single crystal wafer process apparatus comprising: a process chamber; a susceptor which is disposed in the process chamber, and on an upper surface of which the silicon single crystal wafer is placed; and a lift pin which is provided to be capable of a going up and down operation with respect to the susceptor, for attaching or detaching the silicon single crystal wafer to or from the susceptor with the going up and down operation, in a state to support the silicon single crystal wafer from a lower surface side, wherein a contact end surface of the lift pin which contacts a rear surface of the silicon single crystal wafer is formed with a surface roughness of 0.8 µm or less.

2. The silicon single crystal wafer process apparatus as claimed in claim 1, wherein the contact end surface is formed in an upwardly convex curved shape.

3. The silicon single crystal wafer process apparatus as claimed in claim 1, wherein at least the contact surface of the lift pin comprises SiC.

4. The silicon single crystal wafer process apparatus as claimed in claim 2, wherein at least the contact surface of the lift pin comprises SiC.

5. A silicon single crystal wafer process apparatus comprising: a process chamber; a susceptor which is disposed in the process chamber, and on an upper surface of which the single crystal wafer is placed; and a lift pin which is provided to be capable of a going up and down operation with respect to the susceptor, for attaching or detaching the silicon single crystal wafer to or from the susceptor with the going up and down operation, in a state to support the silicon single crystal wafer from a lower surface side, wherein a cylindrical member which slidably guides the lift pin while going upward, is fixedly provided on a susceptor support member in a state to project from the susceptor support member which supports the susceptor, to make a contact end surface of the lift pin contact with the rear surface of the silicon single crystal wafer so as to be approximately parallel to each other and the contact end surface of the lift pin is formed with a surface roughness of 0.8 µm or less.

6. The silicon single crystal wafer process apparatus as claimed in claim 5, wherein a sliding surface of the lift pin to the cylindrical member is polished.

* * * * *